(12) United States Patent
Sharon et al.

(10) Patent No.: US 10,901,840 B2
(45) Date of Patent: Jan. 26, 2021

(54) ERROR CORRECTION DECODING WITH REDUNDANCY DATA

(71) Applicant: Western Digital Technologies, Inc., San Jose, CA (US)

(72) Inventors: Eran Sharon, Rishon Lezion (IL); Idan Alrod, Herzeliya (IL)

(73) Assignee: Western Digital Technologies, Inc., San Jose, CA (US)

( * ) Notice: Subject to any disclaimer, the term of this patent is extended or adjusted under 35 U.S.C. 154(b) by 198 days.

(21) Appl. No.: 16/021,300

(22) Filed: Jun. 28, 2018

(65) Prior Publication Data
US 2020/0004627 A1 Jan. 2, 2020

(51) Int. Cl.
*G11C 29/00* (2006.01)
*G06F 11/10* (2006.01)
*G06F 3/06* (2006.01)
*H03M 13/15* (2006.01)

(52) U.S. Cl.
CPC .......... *G06F 11/1076* (2013.01); *G06F 3/064* (2013.01); *G06F 3/0619* (2013.01); *G06F 3/0673* (2013.01); *G06F 3/0689* (2013.01); *H03M 13/152* (2013.01)

(58) Field of Classification Search
CPC .. G06F 11/1076; G06F 3/0673; G06F 3/0689; G06F 3/0619; G06F 3/064; H03M 13/152; H03M 13/3738; H03M 13/3746
USPC ........................................................ 714/764
See application file for complete search history.

(56) References Cited

U.S. PATENT DOCUMENTS

| | | | | |
|---|---|---|---|---|
| 9,164,839 B2* | 10/2015 | Bennett | ............... | G06F 11/1012 |
| 9,268,635 B2 | 2/2016 | Sharon et al. | | |
| 2004/0088636 A1* | 5/2004 | Cypher | ............... | G06F 11/1048 |
| | | | | 714/764 |
| 2009/0217124 A1* | 8/2009 | Litsyn | ................. | G06F 11/1068 |
| | | | | 714/752 |
| 2011/0107188 A1* | 5/2011 | Dror | .................. | H03M 13/152 |
| | | | | 714/773 |
| 2014/0245105 A1* | 8/2014 | Chung | ................ | G06F 11/1076 |
| | | | | 714/763 |
| 2016/0124784 A1* | 5/2016 | Chung | ................ | G06F 11/1048 |
| | | | | 714/704 |
| 2016/0162357 A1* | 6/2016 | Desireddi | ............. | G06F 3/0679 |
| | | | | 714/764 |
| 2016/0274794 A1* | 9/2016 | Yoon | ..................... | G06F 3/0688 |
| 2016/0364181 A1* | 12/2016 | McGlaughlin | ...... | G06F 11/1012 |
| 2017/0091022 A1* | 3/2017 | Khan | .................... | G06F 11/108 |
| 2017/0255511 A1* | 9/2017 | Lin | ......................... | G06F 3/064 |

(Continued)

*Primary Examiner* — Albert Decady
*Assistant Examiner* — Enamul M Kabir (57) ABSTRACT

Enhanced error correction for data stored in storage devices are presented herein. An error correction circuit decodes an encoded data segment retrieved from a storage media. This decode uses a selected error correction scheme having an error correction limit. The error correction circuit tracks a number of bit corrections made to the encoded data segment during decode. A detection circuit sends a redundant version of the encoded data segment to the error correction circuit in response to the number of bit corrections satisfying a threshold limit set below the error correction limit to mitigate undetected errors in decoding the encoded data segment. An output circuit can transfer resultant data decoded by the error correction circuit to other systems, such as a host device.

22 Claims, 7 Drawing Sheets

(56) References Cited

U.S. PATENT DOCUMENTS

| | | | |
|---|---|---|---|
| 2018/0013451 A1* | 1/2018 | Kaynak | H03M 13/1128 |
| 2018/0074892 A1* | 3/2018 | Shappir | H03M 13/451 |
| 2018/0107541 A1* | 4/2018 | Jalan | G06F 3/0619 |
| 2018/0219561 A1* | 8/2018 | Litsyn | H03M 13/2948 |
| 2019/0081730 A1* | 3/2019 | Oveis Gharan | H03M 13/6312 |
| 2019/0260397 A1* | 8/2019 | Wu | G06F 11/1012 |
| 2019/0310912 A1* | 10/2019 | Parthasarathy | H03M 13/2948 |

* cited by examiner

ERROR CORRECTION DECODING WITH REDUNDANCY DATA

TECHNICAL FIELD

Aspects of the disclosure are related to the field of data storage, particularly to error correction during decoding of data stored on storage devices.

BACKGROUND

Computing systems typically employ data storage systems for storage and retrieval of data accessed by users. Various types of storage devices can be employed in these data storage systems, such as hard disk drives (HDDs) or solid-state drives (SSDs), among others. SSDs employ various underlying storage technology, such as NAND flash arrays. Payload data stored in these arrays is typically encoded using various error correction codes to ensure more reliable data storage despite random read/write errors, interfacing errors, and physical flaws in the underlying storage media. However, these error correction codes, such as Reed-Solomon error correction codes, Hamming codes, Bose-Chaudhuri-Hocquenghem (BCH) codes, can converge to incorrect data values under certain decoding circumstances. More error correction overhead can be added with the payload data during encoding to mitigate incorrect convergence in data decoding. However, storing payload data with further error correction overhead uses more storage space and increases the memory cost, while potentially increasing decoding complexity. Media and latency limitations of certain storage device types might preclude encoding data with further error correction overhead.

OVERVIEW

Enhanced error correction for data stored in storage devices are presented herein. An error correction circuit decodes an encoded data segment retrieved from a storage media. This decode uses a selected error correction scheme having an error correction limit. The error correction circuit tracks a number of bit corrections made to the encoded data segment during decode. A detection circuit sends a redundant version of the encoded data segment to the error correction circuit in response to the number of bit corrections satisfying a threshold limit set below the error correction limit to mitigate undetected errors in decoding the encoded data segment. An output circuit can transfer resultant data decoded by the error correction circuit to other systems, such as a host device.

BRIEF DESCRIPTION OF THE DRAWINGS

Many aspects of the disclosure can be better understood with reference to the following drawings. The components in the drawings are not necessarily to scale, emphasis instead being placed upon dearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Storage devices employed in computing systems have an underlying physical media upon which data can be written. Typically, this data is received from a host device in an unencoded form, and this data might be subsequently encoded prior to media writing using an error correction code (ECC) or other data protection scheme. In some examples, redundancy data or redundancy information can accompany the data on the storage media. Different types of storage media might have different error correction types applied, or different variants of the same error correction. For example, a memory device might employ Bose-Chaudhuri-Hocquenghem (BCH) codes or low-density parity-check (LDPC) codes, among others, to ensure more reliable data storage and compensate for random or transient read/write errors, interfacing errors, and physical flaws in the underlying storage media. However, even when a selected error correcting code is applied to data, the data can still experience errors during reading from the media which might be undetected and consequently lead to incorrect data. A typical solution is to add more and more error correction overhead or parity/checksum bits along with the payload data to mitigate for potential data errors during storage and decoding.

However, adding further error correction overhead can be undesirable in many emerging memory types. These memory types might have limited space for further overhead due in part to cost, have latency requirements which preclude extended encoding/decoding using long error correcting codes, or store data addressable in a manner not conducive to long error correcting codewords. One example memory type includes storage-class memories (SCM) which can be deployed on a processor bus along with dynamic random-access memory (DRAM).

SCM are gaining increasing attraction in recent years to close the access time gap between memory and mass storage, as well as enable next generation high performance computing and big data applications. One of the challenges of using SCM is enabling reliable, cost efficient, and high-performance storage in the presence of random errors and memory defects. Erasure codes, such as XORing across a Redundant Array of Independent Dies (RAID), are used for handling memory defects. Error Correction Codes (ECC) are used for handling random errors. Due to the high performance SCM requirements, low latency algebraic ECC solutions, such as BCH codes, are the preferred choice in SCM. Both the erasure codes and ECC require overprovisioning which effect the SCM cost efficiency. Ensuring data integrity and reliable storage over. SCM can prompt a need for protection against random errors that may be caused by various disturbance affects, such as program disturbs, read disturbs, temperature related disturbs, data retention issues, and the like. These random errors can be handled using ECC schemes in SCM, which encode the data by adding parity bits and allow detection and correction of the errors. SCM can also employ protection against memory defects, such as various shorts or breaks within the memory array. These memory defects can cause colossal errors that exceed the correction capability of the ECC and may result in data corruption or data loss of an entire memory page or die. The memory defects can be handled by erasure codes in SCM. An example solution is XORing across a RAID, which might entail XORing pages or sectors across different dies and storing the resulting XOR page on a separate die. The pages and corresponding XOR results can be referred to as an XOR stripe. This way, if a page is corrupted by a memory defect, the page can be recovered by de-XORing all the un-corrupted decoded pages within the XOR stripe from the XOR page. Both the ECC and the XOR schemes do employ overprovisioning on the SCM, and hence effect SCM cost efficiency. However, example implementations attempt to minimize the overprovisioning that is required for ensuring reliable storage or to maximize the amount of errors that can be handled for a given allocated overprovisioning The high performance and high Quality of Service (QoS) requirements of SCM, imply very harsh latency requirements for the SCM ECC solution. Additionally, SCM can be byte addressable. This means that state of the art, near Shannon-limit performing, iterative ECC solutions, such as LDPC codes, are not as applicable to SCM, due to their large code length and non-deterministic variable decoding latencies. Instead, Algebraic ECC solutions can be employed, such as short BCH codes, whose decoders have near-deterministic very low decoding latencies. Unfortunately, such short codes usually have reduced correction capability and may have non-negligible probability for undetected errors, such as where a decoder converges and outputs incorrect data. The enhanced error correction systems, circuitry, and methods discussed herein provide for reliable data storage and retrieval on various types of storage media while using relatively short error correcting codes. Advantageously, a significantly reduced undetected error rate, less storage space, lower latency, and faster decoding processes are provided.

Figure 1:
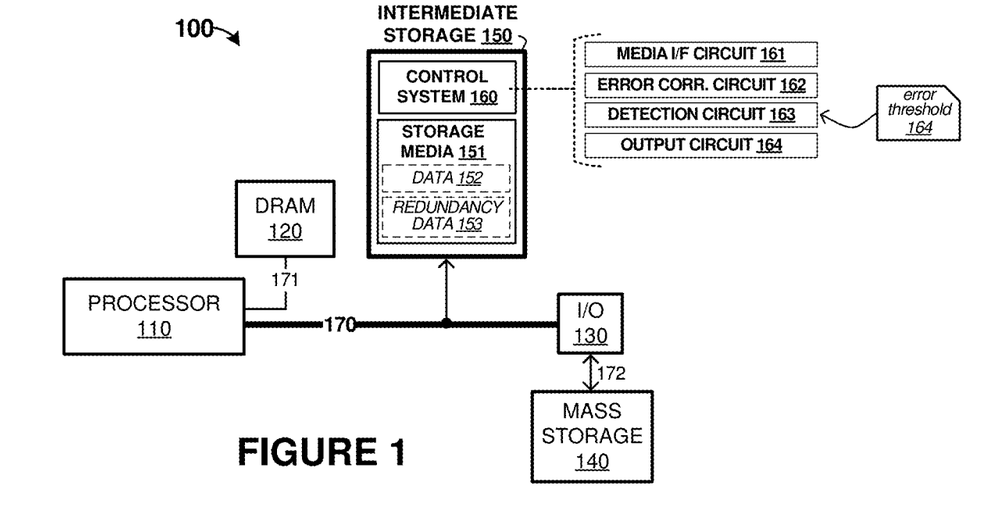
FIG. 1 illustrates an example data storage system.

Turning now to a first example of enhanced error correction, FIG. 1 is presented. FIG. 1 is a system diagram illustrating computing system 100. Computing system 100 includes processor 110, dynamic random-access memory (DRAM) 120, input/output (I/O) node 130, mass storage device 140, and intermediate storage 150. Elements 110-130 and 150 can communicate over communication bus 170. Mass storage device 140 is communicatively coupled to bus 170 through I/O node 130. Intermediate storage 150 comprises storage media which stores data 152 and redundancy data 153. Intermediate storage 150 also includes control system 160 which includes media interface circuit 161, error correction circuit 162, detection circuit 163, and output circuit 164. The error correction operations and elements of FIG. 1 are not limited to any particular memory technology or storage media.

In operation, data is transferred by processor 110 over bus 170 for storage by DRAM 120, intermediate storage 150, or mass storage 140. Intermediate storage 150 can act as a cache in some examples for mass storage 140, or as a supplementary storage for DRAM 120 in other examples. Intermediate storage 150 might instead comprise storage space separate from DRAM 120 or mass storage 140. Regardless of the ultimate destination of data transferred by processor 110, this data can be stored for later retrieval by DRAM 120, intermediate storage 150, or mass storage 140, including combinations thereof. In examples where intermediate storage 150 is employed, intermediate storage 150 can store this data as data 152 along with associated redundancy data 153. During storage of data 152, intermediate storage 150 applies various error correction which typically entails encoding data with an error correcting code into one or more encoded data segments. Redundancy data is also stored in some examples, which can include redundant versions of the original data, checksum data calculated from the original data, parity bits calculated for the original data, or other forms of redundancy data. In one example, data is spread over one or more sub-portions of storage media 151 of intermediate storage 150, and error correction circuit 162 of intermediate storage 150 can calculate exclusive-OR (XOR) results for the data spread of over the sub-portions, and these XOR results can be stored as redundancy data 153.

Once stored onto storage media 151 via media interface circuit 161, data can be later retrieved by media interface circuit 161. As this data is typically stored as one or more encoded data segments, error correction circuit 162 decodes these encoded data segments into decoded data comprising the original data. During the decoding process, one or more errors might be detected in the encoded data segments. These errors can arise from various sources, such as physical defects in storage media 151, read/write errors encountered in handling the data with respect to storage media 151, interfacing errors within the elements of intermediate storage 150, random errors, or other errors, including combinations thereof. Although error correction circuit 162 can correct for a certain quantity of errors in the encoded data segments, there is typically an error correction limit to the quantity of errors correctable by error detection circuit 162. Detection circuit 163 can determine a quantity of errors corrected during the decode process performed by error correction circuit 162. When this quantity reaches a certain predetermined threshold quantity or threshold limit, then detection circuit 163 can initiate a secondary error correction process, which might entail retrieving redundancy data or recreating portions of the encoded data segments using redundancy data. Detection circuit 163 mitigates undetected errors missed by the error correction employed during data decode in error correction circuit 162. Once the encoded data segments have been transformed into decoded data having undetected errors below a target level, then output circuit 164 transfers this decoded data for use elsewhere in system 100.

Figure 2:
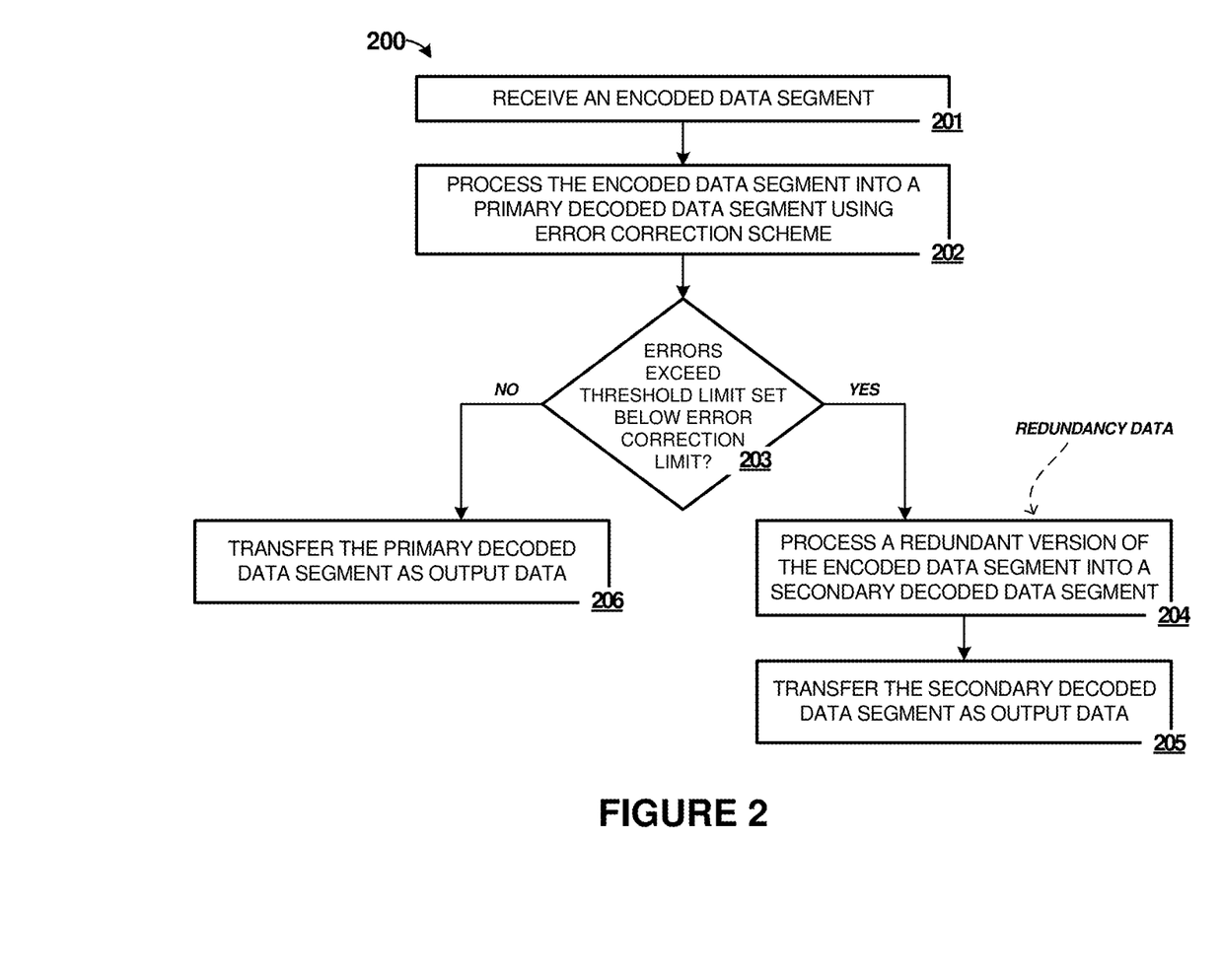
FIG. 2 illustrates an example operation of a data storage system.

Turning now to a more detailed discussion on the decoding and error correction process noted above, FIG. 2 is presented. FIG. 2 is a flow diagram illustrating an example operation of elements of system 100 in FIG. 1. The operations of FIG. 2 are discussed in the context of elements of FIG. 1. However, it should be understood that the operations of FIG. 2 can instead be employed by any of the various storage system examples herein.

In FIG. 2, as data is received for storage by intermediate storage 150, various elements of intermediate storage 150 can encode this data, which before encoding is referred to herein as payload data. Once encoded using one or more selected error correction schemes, resultant encoded data segments are written to storage media 151 by media interface circuit 161. The encoding process employs an error correcting scheme or error correcting code to provide a level of data protection to the payload data. The payload data can be user data, host data, cached data, or other un-encoded data prior to application of the one or more error correction schemes.

At a later time, data can be retrieved from storage media 151 by media interface circuit 161 as one or more encoded data segments. Error correction circuit 162 of control system 160 receives (201) an encoded data segment. This encoded data segment can be retrieved from storage media 151 by media interface circuit 161, which reads data previously written onto storage media 151. Error correction circuit 162 of control system 160 processes (202) the encoded data segment into a primary decoded data segment using a selected error correction scheme. Example error correction schemes include Bose-Chaudhuri-Hocquenghem (BCH) codes or low-density parity-check (LDPC) codes, among others, which can ensure reliable payload data storage despite random read/write errors, interfacing errors in media interface 161, and physical flaws in storage media 151.

The selected error correction scheme used to decode the payload data typically has an error correction limit. The error correction limit refers to a quantity of errors that can be corrected in the encoded data segment before uncorrectable errors surface. Uncorrectable errors indicate data loss for bits that correspond to the uncorrectable errors. In some examples, an error correction scheme can be a BCH-style of error correcting code (ECC) having an encoded data segment size (N), a payload data size (K), and an error correction limit (t) which corresponds to up to t-bits of possible correction in the payload data. When this limit (t) is exceeded, then the encoded data segment might not decode properly into correct payload data, might converge to incorrect values for the payload data, or the payload data might otherwise be lost. Thus, it is desirable to select an amount of ECC overprovisioning to allow for bit corrections in the payload data which meet or exceed desired error rates. Metrics can be used to measure the desired error rates, such as uncorrected bit error rate (UBER), bit error rate (BER), frame-miss error correction rate (FMCR), and a frame error rate (FER). These various error rates will be discussed in more detail below.

However, the amount of ECC overprovisioning might be in opposition to other goals of the memory device or storage device employed, such as reduced memory cost, latency goals, payload data sizes, and other factors. In one example, intermediate storage 150 comprises a storage class memory (SCM) employed to supplement portions of DRAM 120. In this example, intermediate storage 150 might have an access size of 36 bits and a read latency of 500 nanoseconds (ns) or less. The error correction for this example can be a BCH-style of ECC having an encoded data segment size (N) of 63 bits, a payload data size (K) of 36 bits, and an error correction limit (t) of 5 errors which corresponds to up to 5 bit corrections. Also, various error rate requirements or targets might be placed by various data applications, such as having an uncorrected bit error rate (UBER) of $1\times10^{18}$ and a miss-correction (undetected error) rate of $1\times10^{25}$. Unfortunately, for shorter error correcting codes, a frame miss-correction rate (FMCR) is targeted to only be about two orders of magnitude below a frame error rate (FER). As a result, the $1\times10^{25}$ miss-correction requirement can limit the maximum raw bit error rate (BER) over which intermediate storage 150 can operate when employed as this SCM. The examples herein significantly improve both the FMCR and FER for short ECC codes.

To provide these enhancements, a threshold quantity or threshold limit of detected errors is set below the error correction limit of the selected error correction scheme. In this example, the term threshold limit will be referred to, although the term threshold quantity could instead be used. Both threshold limit and threshold quantity can relate to a threshold number of bit errors corrected during a decode process. In many error correction schemes employing an FCC, 't' quantity of errors are correctable using the ECC employed on the encoded data segments. The threshold limit is set to a value below the 't' error correction limit. In FIG. 1, this threshold limit is indicated as error threshold 164, and can be configurable to alter the threshold limit as needed. This threshold limit, such as error threshold 164 in FIG. 1, is set to mitigate undetected errors in decoding encoded data segments. Error threshold 164 can be selected based on various factors. In one example, error threshold 164 is selected based on a target FMCR, or to maintain a target FMCR without degrading FER performance. Error threshold 164 can further be selected to maintain a target difference between a target FMCR and a target FER of the error correction scheme, such as two orders of magnitude indicated above. Error threshold 164 can be adjusted downward as storage media 151 ages, to compensate for media usage and age which can lead to media defects and other forms of degradation.

Returning to the operations listed in FIG. 2, during decode of the encoded data segments by error correction circuit 162, detection circuit 163 detects a quantity of errors corrected in the encoded data segments when producing decoded data. Detection circuit 163 detects if the quantity of errors exceeds (203) the threshold limit set below error correction limit. This determination can be made using various detection techniques. For example, detection circuit 163 might perform a comparison of the threshold limit against a current quantity of corrected bits during a decode performed by error correction circuit 162. In another example, detection circuit 163 can receive an indication of total bits changed due to corrections from error correction circuit 162. In yet further examples, detection circuit 163 can be incorporated into error correction circuit 162 and detection circuit 163 can monitor real-time error corrections made by error correction circuit 162 to detect the quantity of errors.

When the quantity of errors does not exceed the threshold limit, then output circuit 164 transfers (206) the decoded data segment as output data. Decoded data might be held by error correction circuit 162 or output circuit 164 until detection circuit 163 indicates transfer should occur when the criteria of operation 206 have been met. This output data can comprise payload data decoded from one or more encoded data segments into one or more decoded data segments. Decoded data segments might partially be transferred and partially retained in a decoded state for later use. Decoded data segments might be transferred to any of the elements coupled to link 170, such as processor 110, DRAM 120, or I/O node 130. It should be noted that the decoded data segment transferred in operation 206 is referred to herein as a primary decoded data segment or primary decoded data.

When the quantity of errors exceeds the threshold limit, then detection circuit 163 indicates to error correction circuit 162 to perform a secondary error correction process. In this secondary error correction process, error correction circuit 163 processes (204) a redundant version of the encoded data segment into a secondary decoded data segment. The redundant version of the encoded data segment might be introduced to error correction circuit 163 responsive to instructions by detection circuit 163. Error correction circuit 163 can then decode the redundant version of the encoded data segment into a 'secondary' decoded data segment which supersedes the 'primary' decoded data segment discussed above. Similar error correction processes or schemes as used for the encoded data segment above can also be used to decode the redundant version of the encoded data segment. Thus, the primary error correction process can be similar to the secondary error correction process. However, in many examples, a different error correction scheme or error correction process might be employed as the secondary error correction process to decode the redundant version of the encoded data segment. Example secondary error correction schemes are discussed below in FIGS. 3-5.

To obtain the redundant version of the encoded data segment, redundancy data 153 can be retrieved from storage media 151. In other examples, redundancy data 153 is combined with portions of data 152 related to the encoded data segment to create or reconstruct the redundant version of the encoded data segment. In yet further examples, the redundant version of the encoded data segment is at least partially reconstructed from redundancy data 153 using parity data, checksum data, XOR data, redundantly stored data portions, or other data types. Once the redundant version of the encoded data segment is retrieved, formed, reconstructed, or otherwise obtained, then error correction circuit 162 can decode the redundant version of the encoded data segment. Error correction circuit 162 decodes the redundant version of the encoded data segment into a secondary decoded data segment.

Output circuit 164 transfers (205) the secondary decoded data segment as the output data. Typically, when the secondary decoded data segment is determined using the secondary error correction process, then this secondary decoded data is transferred instead of the primary decoded data segment. As with the primary process above, the secondary decoded data might be held by error correction circuit 162 or output circuit 164 until detection circuit 163 indicates transfer should occur when the criteria of operation 206 have been met. As with the primary decoding process, the output data can comprise payload data decoded from one or more encoded data segments into one or more decoded data segments. Decoded data segments might partially be transferred and partially retained in a decoded state for later use. Decoded data segments might be transferred to any of the elements coupled to link 170, such as processor 110, DRAM 120, or I/O node 130. It should be rioted that the decoded data segment transferred in operation 205 is referred to herein as a secondary decoded data segment or secondary decoded data.

Returning to a discussion on the elements of FIG. 1, processor 110 may comprise a microprocessor and processing circuitry that retrieves and executes software from one or more storage systems. Processor 110 may be implemented within a single processing device, but may also be distributed across multiple processing devices, sub-systems, or specialized circuitry, that cooperate in executing program instructions and in performing the operations discussed herein. Examples of processor 110 include general purpose central processing units, application specific processors, and logic devices, as well as any other type of processing device, combinations, or variations thereof.

Dynamic random-access memory (DRAM) 120 comprises a volatile, non-transitory data storage system, although variations are possible. DRAM 120 can comprise any storage media readable by processor 110 and capable of storing software or other data. DRAM 120 can include volatile media implemented in any method or technology for storage of information, such as computer readable instructions, data structures, program modules, or other data. Typically, DRAM 120 comprises semiconductor memory media comprising transistor-based integrated circuit memory chips, such as synchronous dynamic random-access memory (SDRAM) or double data rate (DDR) SDRAM. DRAM 120 also can include various buffer circuitry, refresh circuitry, and interface circuitry. Although dynamic random-access memory is shown in FIG. 1, other examples can employ other memory types, such as static random-access memory (SRAM), or other forms of volatile memory.

I/O node 130 includes one or more communication interfaces or network interfaces for coupling devices to link 170. I/O node 130 can include transceiver circuitry, buffer circuitry, protocol conversion circuitry, interface conversion circuitry, and other related circuitry. The communication interfaces can include peripheral component interconnect express (PCIe) interfaces, universal serial bus (USB) interfaces, I/O Controller Hub (ICH) interfaces, Platform Controller Hub (PCH) interfaces, HyperTransport (HT) interfaces, InfiniBand interfaces, Fibre Channel interfaces, Ethernet interfaces, serial interfaces, serial peripheral interface (SPI) links, inter-integrated circuit (I2C) interfaces, universal asynchronous receiver-transmitter (UART) interfaces, wireless interfaces, or one or more local or wide area network communication interfaces which can communicate over Ethernet or Internet protocol (IP) links.

Mass storage 140 may comprise any computer-readable storage media. Mass storage 140 may include volatile and nonvolatile storage media, removable and non-removable storage media implemented in any technology for storage of information, such as computer readable instructions, data structures, program modules, or other data. Examples of storage media include random access memory, read only memory, magnetic disks, hard disk drives (HDDs), flash memory, solid-state storage drives (SSDs), hybrid disk drives, 3D XPoint storage, magnetic random-access memory (MRAM), phase-change memory (PCM), resistive random-access memory (ReRAM), memristor memory, optical disks, magnetic cassettes, magnetic tape, or other magnetic storage devices, or any other suitable storage media.

Intermediate storage 150 comprises one or more data storage devices, which might comprise non-volatile portions and volatile portions. Intermediate storage 150 includes interfacing elements, control elements, and non-transitory storage media elements. Specifically, Intermediate storage 150 includes control system 160 comprised of media interface circuit 161, error correction circuit 162, detection circuit 163, output circuit 164. Elements of control system 160 can be separate as shown in FIG. 1, or instead might be combined to form unified circuit elements. In specific examples, media interface circuit 161, error correction circuit 162, detection circuit 163, output circuit 164 can each comprise logic circuitry, processing devices, transceiver circuitry, temporary storage elements, among other elements. Discrete electronics, logic circuitry, and other circuitry might be employed to form elements of media interface circuit 161, error correction circuit 162, detection circuit 163, and output circuit 164. In other examples, portions of media interface circuit 161, error correction circuit 162, detection circuit 163, and output circuit 164 might be implemented in various integrated circuits, such as processing systems, microcontrollers, microprocessors, field-programmable gate arrays (FPGA), application-specific integrated circuits (ASIC), or other integrated systems.

Media interface circuit 161 comprises circuitry to interface with and control specific storage media types employed, such as flash interfaces, Open NAND Flash Interfaces (ONFI), magnetic random-access memory (MRAM) interfaces, resistive random-access memory (ReRAM) interfaces, among others. Media interface circuit 161 can include control circuitry to perform media access, media writes, media reads, garbage collection, read scrub operations, partitioning, and logical-to-physical address translation. Media interface circuit 161 can also track logical-tophysical address translations and media defects, such as physical errors, using one or more data structures stored in various non-volatile memory devices.

Error correction circuit 162 comprises one or more encoder and decoder circuits. The encoder circuits encode payload data into encoded data segments using an error correcting code for storage onto storage media 151. The decoder circuits decode encoded data segments read from storage media 151 into decoded data segments. Error correction circuit 162 can be configured to employ various error correcting codes and error correction schemes. The encoder circuits can calculate parity information, checksum information, and other redundancy data and data protection information. Moreover, the decoder circuits reconstruct data from redundancy data stored onto storage media 151.

Detection circuit 163 includes logic circuitry to monitor decoding operations of error correction circuit 162 to determine when errors corrected in encoded data segments during decode exceed threshold limits Detection circuit 163 also controls selection among primary and secondary error correction processes during decode of encoded data segments. Detection circuit 163 can also control output of decoded data via output circuit 164. Output circuit 164 comprises one or more transceivers, communication interfaces, and link management circuits. Output circuit 164 interfaces with link 170 to communicate with other elements of system 100, such as processor 110 and I/O node 130.

Intermediate storage 150 also includes storage media 151 can comprise one or more physical storage media elements, which might be include memory/storage dies or memory/storage chips divided into one or more logical partitions. Specific examples of storage media 151 can include magnetic random-access memory (MRAM), resistive random-access memory (ReRAM), NAND/NOR flash memory, memristor memory, 3D XPoint memory, phase-change memory (PCM), as well as other storage technologies discussed herein. In a specific example, intermediate storage 150 can comprise a storage-class memory suitable for low-latency access by processor 110. Due to the low latency and appropriate selection of data access sizes and addressing, processor 110 can employ intermediate storage 150 as a DRAM replacement or internal DRAM replacement (IDR).

Link 170 comprises various peripheral, memory, or storage links, such as PCIe links, universal serial bus (USB) links, I/O Controller Hub (ICH) links, Platform Controller Hub (PCH) links, HyperTransport (HT) links, or InfiniBand interfaces, among others. Link 171 comprises one or more memory links, such as DRAM links or DDR memory links, among others. Link 172 comprises one or more storage device links, such as serial AT attachment (SATA) links, PCIe links, NVMe links, USB links, SDcard links, Thunderbolt links, Ethernet links, or packet network links, among others. Various electrical or optical transport elements can be included in links 170-172, such as conductive traces, optical waveguides, or wireless links for interconnecting the various elements indicated.

Figure 3:
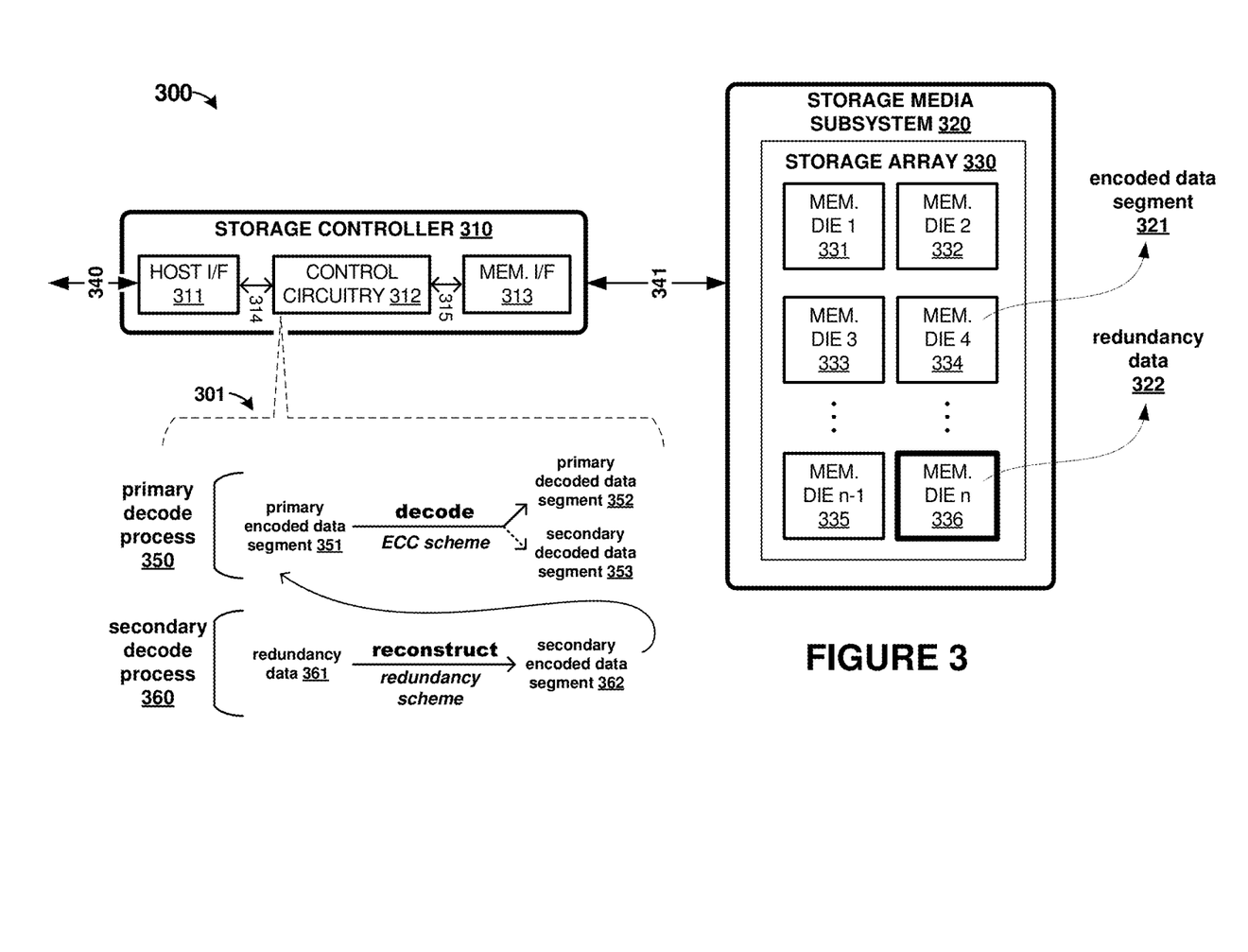
FIG. 3 illustrates an example data storage system.

Turning now to a further example of enhanced error correction and data protection, FIG. 3 is presented. FIG. 3 illustrates example data storage system 300. System 300 includes storage controller 310 coupled to storage media subsystem 320 over link 341. Link 341 represents one or more links in FIG. 3. Storage controller 310 further includes host interface (I/F) 311, control circuitry 312, and memory interface (I/F) 313. Storage media subsystem 320 further includes storage array 330 formed from a plurality of separate memory dies (1-n) 331-336. Storage controller 310 is coupled to one or more external systems, such as a host system, over link 340. In some examples, storage controller 310 and storage media subsystem 320 together comprise a data storage device, data storage drive, or data storage system.

In operation, storage controller 310 receives storage operations from an external system over link 340, such as host system. These storage operations can include data write operations, data read operations, data erase operations, and various data administration operations, among others. Host interface 311 comprises transceiver circuitry and other communication interfacing elements to communicate over link 340 and provide received storage operations to control circuitry 312 over link 314. Control circuitry 312 includes the various processing circuitry described herein, such as that for control system 160 of FIG. 1. Control circuitry 312 encodes/decodes data for storage and retrieval from storage media subsystem 320. Encoded data can be exchanged during storage/retrieval over link 315, and memory interface 313 can execute the storage operations with regard to the underlying storage media. Since different underlying types of storage media discussed herein might have different read, write, and erase characteristics/operations, addressing specifications, and storage media maintenance operations, then memory interface 313 can be customized in light of these various types of storage media. Memory interface 313 communicates with the storage media over one or more links represented by link 341 in FIG. 3.

The storage media, or more specifically storage media subsystem 320, is comprised of 1-n memory dies in FIG. 3, notably memory dies 331-336. These memory dies form storage array 330, and can each be logically and physically partitioned according to specific design selections made for storage media subsystem 320. Each memory die comprises an individual microchip-based storage device, such as NAND flash chips, MRAM storage chips, or other solid-state storage technologies discussed herein. Data stored onto memory dies 331-336 can be spanned over more than one die, mirrored over more than one die, or stored in various redundant configurations the involve one or more dies. In the examples herein, storage media subsystem 320 stores data with ECC applied, namely encoded data segments 321 provided by memory interface 313. Moreover, according to the enhanced operations discussed herein, redundancy data 322 is also stored by storage media subsystem 320. Although redundancy data 322 can reside anywhere in storage media subsystem 320 in various data redundancy configurations, in this example it is stored as resultant XOR data on a dedicated memory die 336.

As mentioned above, control circuitry 312 performs various data encoding, decoding, and other data storage/handling processes. During an encoding process, data received over link 340 is encoded using one or more error correction schemes to produce resultant codewords. These resultant codewords are referred to herein as encoded data segments, and comprise both payload data and ECC information. Once encoded, the data and ECC information may not be separately distinguished within an encoded data segment until a decoding process occurs. The decoding process uses the ECC information to correct for a maximum quantity of correctable errors within the encoded data segments, and produces decoded payload data as a result. If fewer errors than the maximum quantity of correctable errors are found in the encoded data segment during decode, then the decoded data result will contain valid data. If more errors than the maximum quantity of correctable errors are found in the encoded data segment during decode, then the decoded data will contain invalid data which can be considered unreliable, lost, or unusable. However, due to the workings of particular error correction schemes, undetected errors can still occur in the decoded data segments, even when the maximum quantity of correctable errors is not exceeded. These undetected errors can lead to invalid or unusable data that is mistakenly considered as valid. However, since the errors are not detected they can propagate to further data systems. When user data comprises the decoded data, then undetected errors might lead to inaccurate user data, such as numerical data in spreadsheets, text content in documents, or metadata content leading to data or filesystem corruption. When system data comprises the decoded data, such as filesystem data, computer management data, or other underlying data used in the operation of an associated computing system, then operational errors can occur, as well as crashes, lost data, or other serious errors.

To overcome at least some of the risk of undetected errors in storage systems, operations 301 of FIG. 3 are presented along with corresponding structural elements of system 300. In operations 301, two decoding processes are detailed, namely primary decode process 350 and secondary decode process 360. Control circuitry 312 determines when to use primary decode process 350 and secondary decode process 360, based in part on resultant errors detected during decode of encoded data segments using primary decode process 350. A threshold limit can be established which is lower than the maximum quantity of correctable errors for the selected error correction scheme. When this threshold limit is reached or exceeded during primary decode process 350, then secondary decode process 360 is deployed.

Specifically, in primary decode process 350, control circuitry 312 receives primary encoded data segment 351 which is stored on storage media subsystem 320. Control circuitry 312 decodes primary encoded data segment 351 using a selected ECC scheme. Typically, the ECC scheme originally used to encode the data segment will be deployed during decode, such as one that uses a Bose-Chaudhuri-Hocquenghem (BCH) error correction code. This decode process produces primary decoded data segment 352. During decode, control circuitry 312 determines how many errors were corrected using the ECC scheme to produce primary decoded data segment 352. The number of errors might correspond to data corrections made during decode using the ECC scheme, such as corrective bit flips in the data from '1' to '0' or vice-versa. If the number of errors is less than the threshold limit set below that of the maximum quantity of correctable errors, then storage controller 310 can consider primary decoded data segment 352 successfully decoded. Host interface 311 can transmit primary decoded data segment 352 as output data over link 340. If the number of errors is greater than the maximum quantity of correctable errors, then the decoded data is considered invalid, and storage controller 310 can discard the decoded data or transmit one or more corresponding error messages over link 340.

However, if the number of errors is greater than the threshold limit set below that of predetermined maximum quantity of errors but still less than the predetermined maximum quantity of errors, then secondary decode process 360 is performed. In secondary decode process 360, redundancy data 361 is employed to produce another decoded data segment. First, redundancy data 361 is retrieved from storage media subsystem 320, which might be located in a specifically reserved memory die or memory location. In FIG. 3, this might correspond to memory die 336, although other configurations are possible. Control circuitry 312 determines secondary encoded data segment 362 using at least redundancy data 361, which might include reconstructing or replacing portions of primary encoded data segment 351 using redundancy data 361. Redundancy data 361 might comprise XOR results across one or more memory dies, parity data, checksum information, redundantly stored encoded data segments, or other data redundancy information. After determination of secondary encoded data segment 362, control circuitry 312 can introduce secondary encoded data segment 362 into primary decode process 350. Primary decode process 350 again performs a decode but with secondary encoded data segment 362 instead of primary encoded data segment 351. Primary decode process 350 produces secondary decoded data segment 353 resultant from decoding secondary encoded data segment 362. Storage controller 310 can transmit secondary decoded data segment 353 over link 340. As with the original primary decode process 350 and primary encoded data segment 351, various data integrity checks and detection of the quantity of error corrections made during decode of secondary decoded data segment 353 can trigger error messages, further redundant data retrieval and decoding, or other processes.

Although operations 301 discuss redundancy data 322 as separate data stored on a separate memory chip/die, other forms of redundancy data can be employed. For example, redundant copies (or portions) of encoded data segments might be stored over one or more memory dies, or a version of redundancy similar to redundant array of independent storage (RAID) systems can be employed. In some examples, reconstruction is needed to form secondary encoded data segment 362, while in other examples no reconstruction is performed as secondary encoded data segment 362 is stored intact by storage media subsystem 320. Also, although secondary encoded data segment 362 is introduced to a decode process similar to primary decode process 350, other decoding processes can be employed. For example, extra parity bits might be employed as redundancy data 361, and these extra parity bits can be introduced to enhance primary decode process 350 or used as inputs to yet another decode process different than primary decode process 350.

Figure 4:
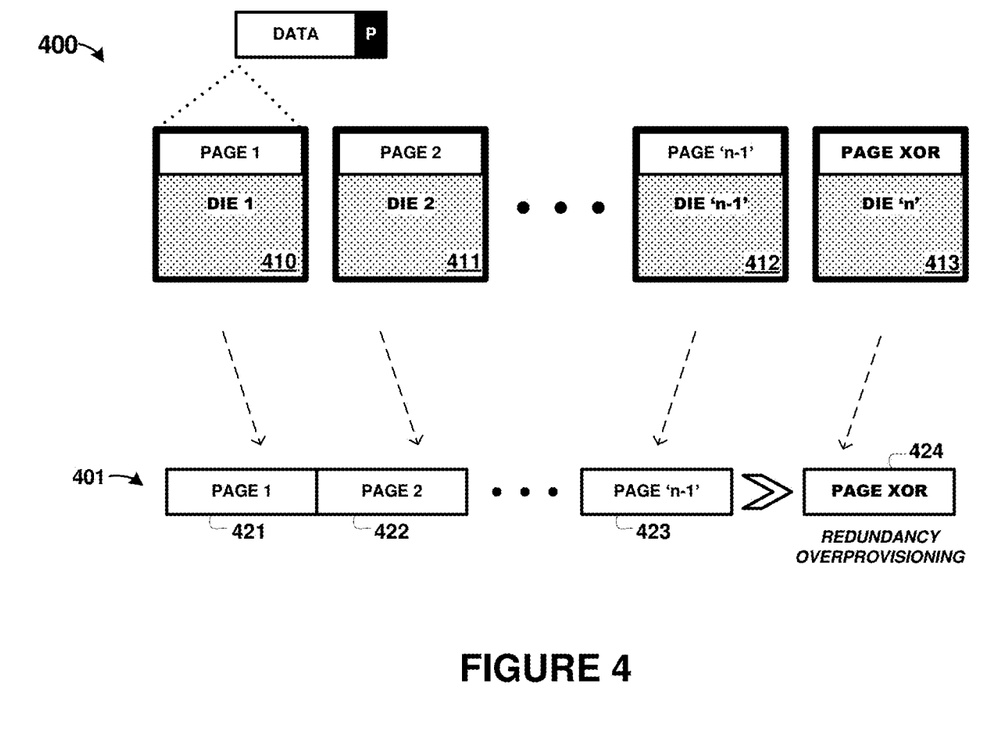
FIG. 4 illustrates example data storage schemes for a data storage system.
Figure 5:
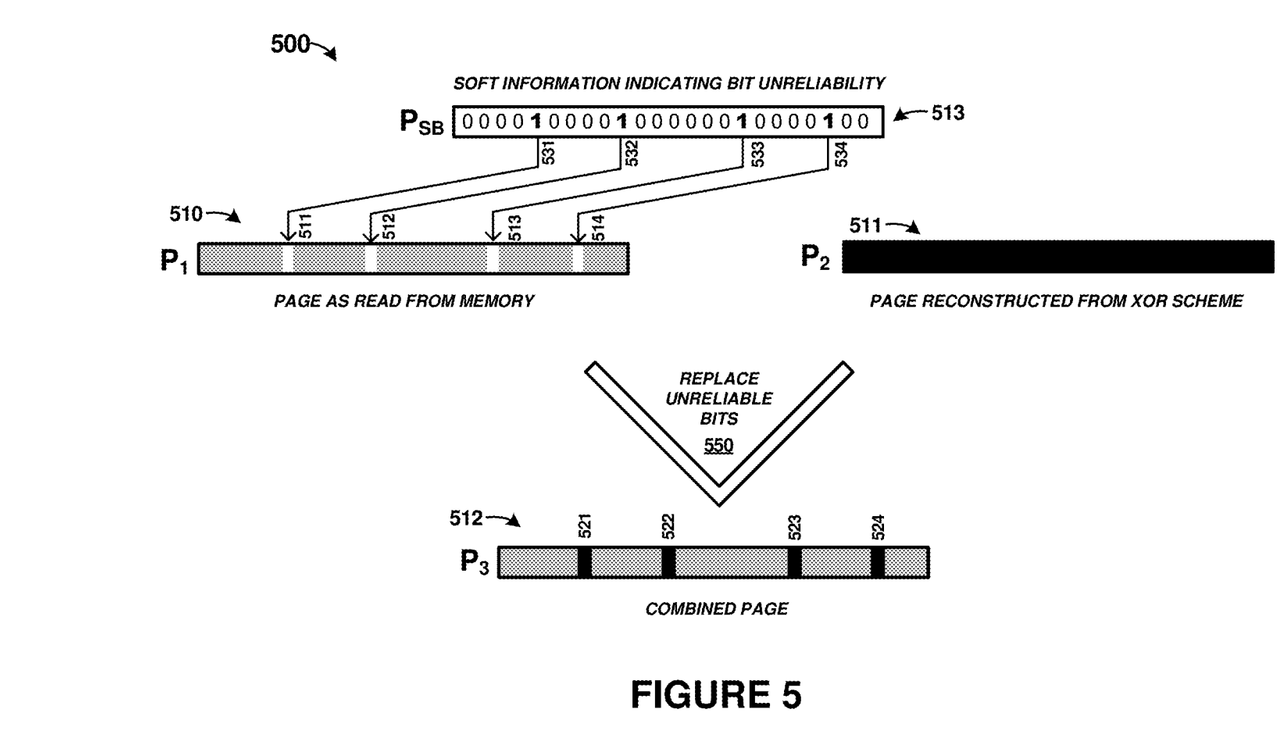
FIG. 5 illustrates example data decoding schemes for a data storage system.

FIGS. 4 and 5 are presented to illustrate further examples of redundancy in data storage, reconstruction, and subsequent secondary decode. Typically, ECC and associated error correcting schemes work well for data protection related to bit errors due to random errors in read/write operations, random data degradation after storage, or other data errors. However, physical defects in storage media, such as in memory chips/dies, can be more difficult to correct using ECC and associated error correcting schemes. This can be due to the large amount of errors, the physical proximity of errors, or the nature of the underlying physical defects, among other causes. Using a separate physical memory chip/die to store redundancy data can increase data reliability due to physical media defects/damage, and overcome limitations of ECC and associated error correcting schemes. FIG. 4 illustrates one such example of storing redundancy data in separate memory dies.

The examples in FIGS. 4 and 5 can be included in the operations detailed above for operations 301 and system 300, although variations are possible. Turning first to FIG. 4, configuration 400 illustrates data storage over 1-n memory dies, such as dies 331-336 in FIG. 3. FIG. 4 includes dies 410-413 to illustrate 1-n memory dies, and each die can comprise storage space for a plurality of data pages. Data pages comprise logical organizations among portions of data, where a page is defined as a certain quantity of bytes of data. Although pages can correspond to physical arrangements of the storage media used in dies 410-413, this need not be the case in all examples. Pages 1, 2, . . . n–1 are shown in FIG. 4, which can correspond to a quantity of dies employed in a memory subsystem. Each page is comprised of payload data (DATA) and parity information (P), as seen in FIG. 4 for page 1 on die 410. These pages also comprise encoded data segments which have been encoded using one or more error correcting schemes.

A final memory die 'n' (413) stores redundancy data. In FIG. 4, redundancy data comprises an XOR result calculated for pages stored over one or more memory dies. As can be seen in configuration 401, page 1 (421), page 2 (422), and page n–1 (432) have an XOR operation performed thereon, and a page XOR result 424 is determined. Page XOR result 424 corresponds to redundancy overprovisioning for each of the pages 421-423, and any of the pages 421-423 can use page XOR result 424 as redundancy data.

Specifically, in FIG. 3, XOR result 424 can be computing during a write process for encoded data segments being written onto storage array 330. Control circuitry 312 can compute XOR result 424 for pages stored over one or more of memory dies 331-335, and store this XOR result in memory die 336. During secondary decode process 360, redundancy data 361 can comprise this XOR result read from memory die 336. A reconstruction process can be performed to determine secondary encoded data segment 362 from at least the XOR result. This reconstruction process can employ the XOR result along with data pages used to initially compute the XOR result—omitting the data page that experienced the errors. For example, page 1 might be currently undergoing a decode operation which encounters too many errors to be reliable, according to the operations detailed herein. The XOR result computed during storage of page 1, along with other pages (e.g. page 2, 3, . . . 1-n), can be used to reconstruct the data that forms page 1. This reconstructed version of page 1 can then be decoded to produce an output/result. In further examples, only selected portions of the page experiencing errors and selected portions of the reconstructed page are employed to form a combined page for decoding.

FIG. 5 details an example reconstruction process using XOR results stored in memory dies separate from encoded data. In FIG. 5, configuration 500 illustrates several example data pages used in an enhanced decode process. Page $P_1$ (510) comprises a data page as read from memory, and would correspond to primary encoded data segment 351 in FIG. 3. Page $P_2$ (511) comprises a data page reconstructed from the XOR scheme included in FIG. 4. Page $P_3$ (512) comprises a combined page made from portions of page $P_1$ and page $P_2$ using reliability replacement operation 550. Furthermore, page $P_{SB}$ comprises 'soft bit' information indicating bit unreliability which is used during process 550 to replace unreliable portions of page $P_1$.

As discussed herein, when a primary decoding process is employed, such as that described in FIG. 3 for process 350, an encoded page read from memory is decoded. If that encoded page encounters a quantity of errors during the decoding process that exceed a particular threshold limit, then a secondary decoding process can be employed. The secondary seconding process can reconstruct pages from XOR data stored in one or more redundant memory locations. This XOR data can be used to calculate a secondary encoded page, using data from other pages that were used when the XOR data was originally calculated. In FIG. 5, page $P_1$ might be such as page that experiences enough errors during decode to exceed a threshold limit. Page $P_2$ can be reconstructed using XOR data and other pages used to calculate the XOR data along with page $P_1$.

However, the page reconstruction process can be more computationally difficult and time consuming than a mere read of a page, and thus only selected portions of the page might be reconstructed. Moreover, only portions of page $P_1$ might be unreliable, and thus only these portions need be replaced using redundancy data. The portions to be reconstructed can be selected using reliability data for the original page that is experiencing errors during decode. Page $P_{SB}$ indicates a bit mask or bit locations of portions of a page $P_1$ which are less reliable than other portions. A '1' indicates estimated reliability falling below a reliability threshold, and a '0' indicates estimated reliability above the reliability threshold. The estimated reliability can be computed in various ways. In one example, bits corresponding to memory cells or locations on the storage media which exhibit bit error rate (BER) above a target BER indicate unreliable bits, and bits which exhibit BER below a target BER indicate reliable bits.

Figure 7:
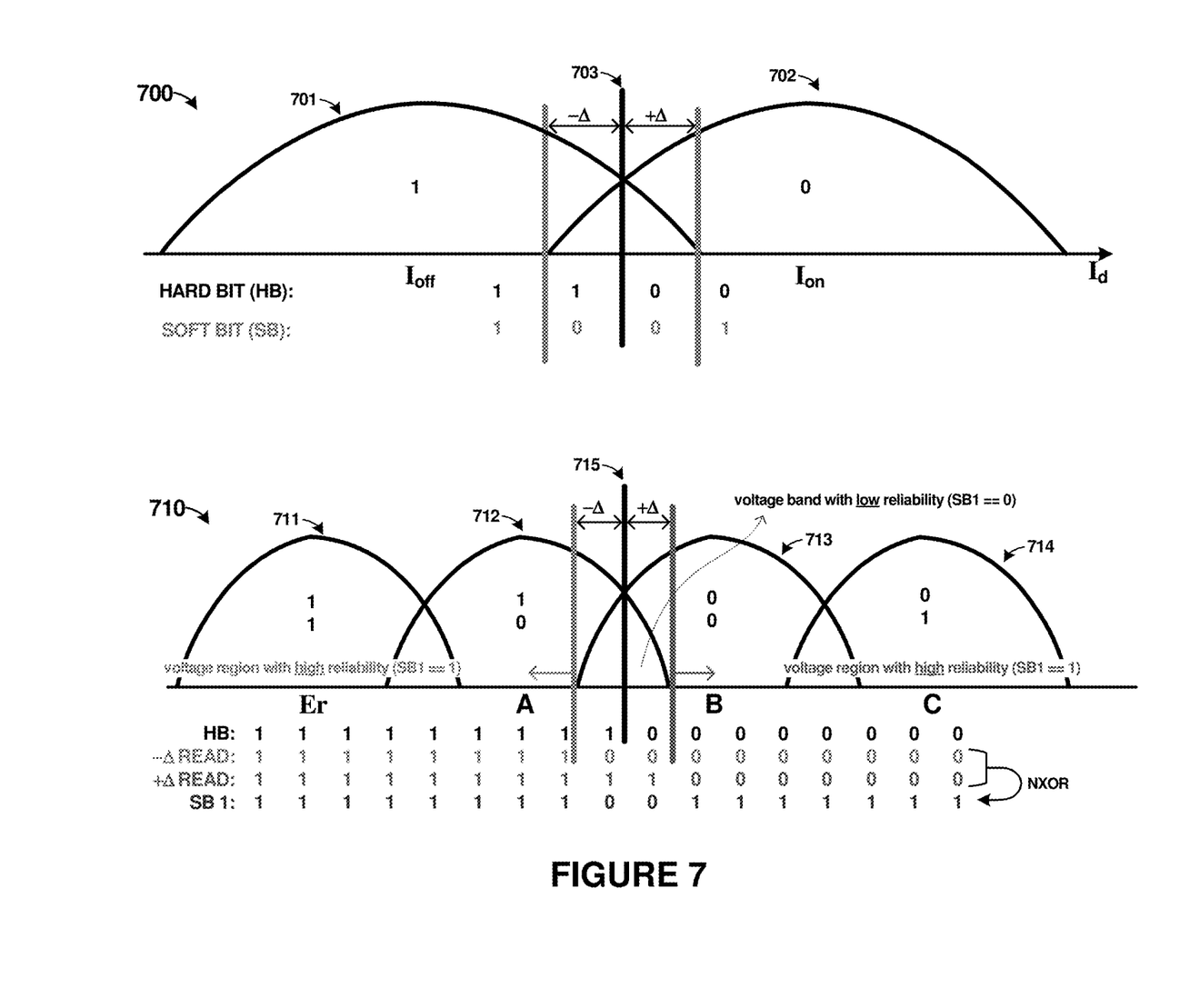
FIG. 7 illustrates example data reliability operations for a data storage system.

One example approach for obtaining $P_{SB}$ is by performing higher resolution reading of required page ($P_1$) in order to identify which memory cells have a threshold voltage Vt or threshold current Fr which is close to a state transition region, and hence are expected to be less reliable. FIG. 7 details such a read process, referred to as a soft bit (SB) read. Example 700 relates a soft bit read performed in a phase-change memory (PCM) with a Single Level Cell (SLC). A current distribution of memory cells is shown in example 700 as curves 701 and 702. Example 710 relates to a soft bit read in a NAND flash memory with a Multi-Level Cell (MLC). A voltage distribution of memory cells is shown in example 710 as curves 711-714.

Operation 700 in FIG. 7 illustrates one example soft bit read, which may be performed by reading at −Δ and +Δ from the nominal read point 703 to obtain two read results corresponding to −Δ and +A. Then, exclusive NOR (NXOR) operations are performed between these two read results to obtain $P_{SB}$. Operation 710 in FIG. 7 illustrates another example soft bit read, which may be performed by reading at −Δ and +Δ from the nominal read point 715 to obtain two read results corresponding to −Δ and +Δ. Then, exclusive NOR (NXOR) operations are performed between these two read results to obtain $P_{SB}$.

Once indications of which bits in page $P_1$ are reliable and unreliable are determined in page $P_{SB}$, then portions of $P_1$ corresponding to the unreliable bits can be omitted in combined page $P_3$. Portions of reconstructed page $P_2$ can be used to fill in or replace these unreliable bits omitted from page $P_1$ when forming page $P_3$. Operation 550 includes the replacement process for unreliable bits in page $P_1$ to form page $P_3$. As can be seen in FIG. 5, bits 511-514 of page $P_1$ are noted as unreliable based on indications 531-534 in page $P_{SB}$. Corresponding bits 521-524 from page $P_2$ are combined into page $P_1$ to form page $P_3$. Page $P_3$ can then be employed in decode process to determine decoded data, as discussed herein. For example, page $P_3$ might comprise secondary encoded data segment 362 of FIG. 3.

Figure 6:
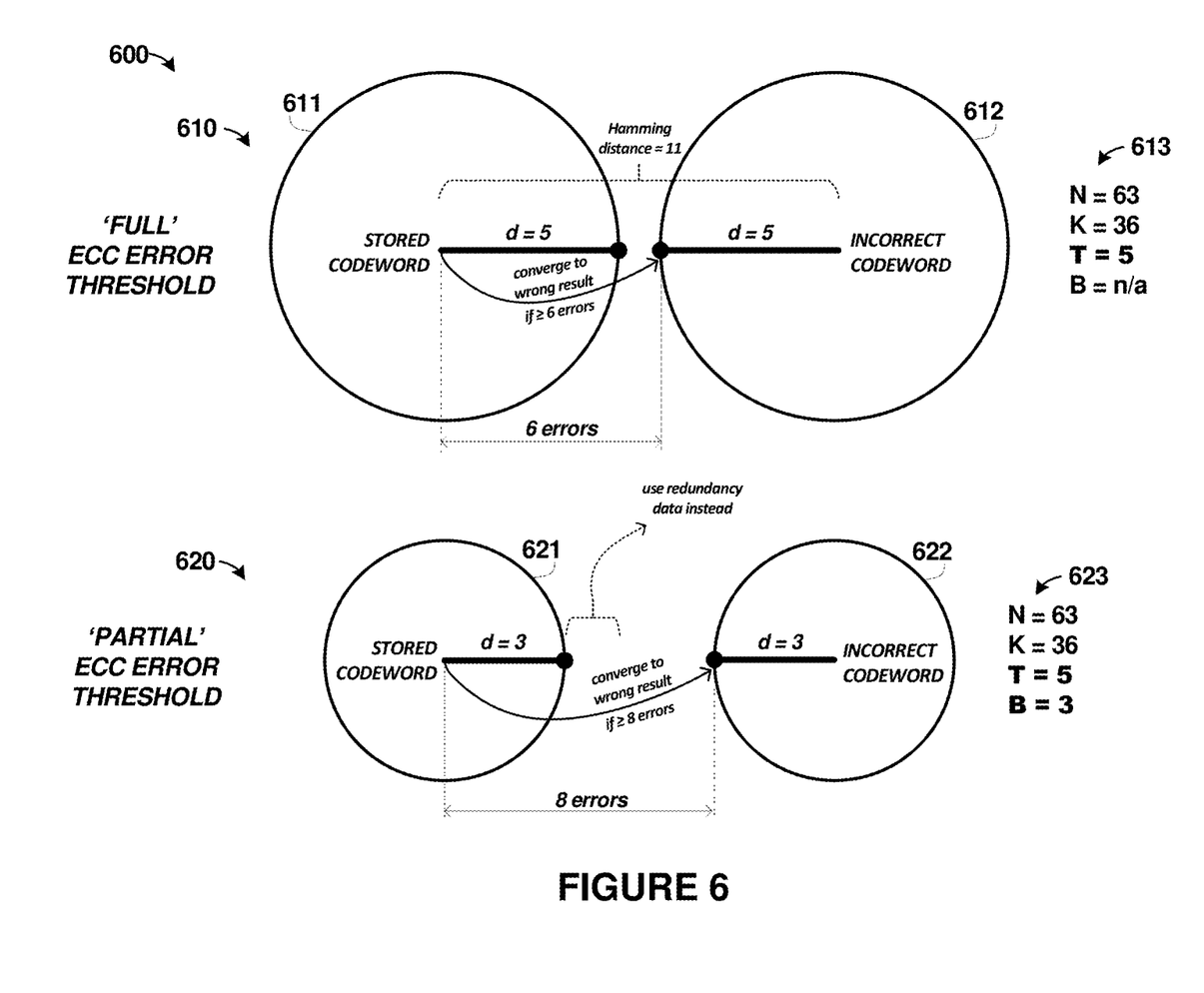
FIG. 6 illustrates example data decoding results for a data storage system.

FIG. 6 details example decoding convergence configurations 600. The enhanced decoding examples discussed herein use a threshold limit which is set below an error correction capability of an error correction scheme employed in encoded data segments. The error correction capability comprises a maximum quantity of bits that can be corrected using the error correction scheme and ECC for the codeword stored on the storage media. This threshold limit is set at least one bit below that of the error correction capability. Example 610 employs no threshold limit, and relies upon a quantity of bits correctable according to the error correction capability. Example 620 employs a threshold limit set below that of the error correction capability.

The error correction scheme employed for both example 610 and 620 is the same for illustrative purposes. Properties of the error correction scheme are labeled as 613 and 623 in FIG. 6. Specifically, the error correction scheme uses a codeword size (e.g. size of the encoded data segment) of N=63, a payload data size of K=36, and an error correction capability of T=5 bits potentially correctable in the payload data due to errors in the codeword. Also, the threshold limit (B) of FIG. 6 is set at 3 bits, which is two bits below that of the error correction capability. The error correction scheme corresponds to a Hamming distance of 11, as noted in FIG. 6. The Hamming distance indicates the minimal number of bit substitutions or changes between the stored codeword (correct decoding result) and the nearby other codeword (which if output by the decoder would be an incorrect result, causing an undetected error).

Turning first to example 610, a stored codeword of 63 bits can be decoded using a decode process symbolized by circular range 611 to produce correct resultant payload data and circular range 612 to produce incorrect resultant payload data. Since the error correction capability is used in example 610, namely up to 5 bits of correction, then the 'full' capabilities of the error correction scheme are employed. Example 610 thus uses a 'full' ECC error threshold of T=5. If ≥6 errors are encountered during decode in example 610, then the decode process might converge onto an incorrect codeword represented by circular range 612.

In contrast, example 620 employs a threshold limit set below that of the 'full' capability of the error correction scheme. This threshold limit sacrifices some of the error correction capability in lieu of mitigating or reducing undetected errors in converged results of decode operations. In the gap created between the threshold limit and the error correction capability, redundancy data can be employed. The redundancy data can be used to reconstruct unreliable portions of the original codewords, or to replace one or more portions of the original codewords.

Specifically, example 620 also uses a stored codeword of 63 bits which can be decoded using a decode process symbolized by a circular range 621 to produce correct resultant payload data and circular range 622 to produce incorrect resultant payload data. Since the threshold limit is set below the error correction capability in example 620, namely up to 3 bits of correction, then 'partial' capabilities of the error correction scheme are employed. Example 620 thus uses a 'partial' ECC error threshold of B=3. In this case, only if ≥8 errors are encountered during decode in example 620, then the decode process may converge onto an incorrect codeword represented by circular range 622. However, if less than less than 8 errors are encountered, redundancy data can be employed which mitigates potential undetected errors and prevents incorrect data convergence.

A given primary decoding scheme might be based on a length 'n' BCH code protecting 'k' information bits, which corrects 't' errors. The primary decoding scheme can be determined according to a required SCM access size (which relates to 'k') and amount of ECC overprovisioning (which relates to 't'), and the value of B can be optimized in order to tradeoff the undetected error rate (FMCR) and the secondary decoding scheme (e.g. RAID) triggering frequency (which is limited from latency requirements). As more correction capability is sacrificed in the primary decoding stage, then a lower undetected error probability is achieved, but the frequency of secondary decoding triggering increases.

Advantageously, the enhanced data protections schemes and error correction circuitry, systems, and methods described herein provide for greater data storage reliability. Moreover, faster, lower latency data access can be provided by using smaller codewords when storing data using ECC protection. Although ECC can protect for many types of errors, the ECC also has a limit to how many errors can be corrected in data. Moreover, undetected errors still can arise in seemingly successfully decoded data. Processing encoded data that uses ECC protection into decoded data can be time consuming and computationally complex. Further ECC overhead is typically included to meet target error rates. However, the addition of addition ECC overhead can increase latencies of data retrieval due to increased computation times during decode of such data. This leaves many forms of ECC unsuitable for low-latency storage that requires high reliability. In the examples herein, less ECC overhead is required leading to reduced decode delays and less latency during data retrieval.

However, to ensure data reliability is above target levels and error rates are below target rates, redundancy data is employed. A threshold limit is established below that of an error correction capability of the selected error correction scheme. For example, if the error correction scheme can correct up to 't' bits in a codeword or encoded data segment, then the threshold limit is set to t-x. Typically, ECC is effective against random or transient data errors, but might be less effective for physical defects and media degradation. The enhanced techniques described herein can employ redundancy data and secondary decoding processes only when needed. This leads to usage of smaller quantities of ECC overhead when storing data, and thus less storage space required for payload data and faster decode. Moreover, when the enhanced data protections techniques discussed herein are employed, less memory space is needed to store payload data as compared to larger ECC overhead examples, due in part to smaller ECC needed to meet similar target error rates.

In some implementations of the systems, circuitry, and elements discussed herein, an enhanced data error corrector can be established. The data error corrector can comprise data protection circuitry and decoder circuitry, among other circuitry. The data error corrector can include a means for processing an encoded data segment into a first decoded data segment using at least an error correction scheme having an error correction limit. The data error corrector can include a means for processing a redundant version of the encoded data segment into a second decoded segment using at the least the error correction scheme. The data error corrector can include a means for selecting a data output as the second decoded data segment when a quantity, of error corrections made to produce the first decoded data segment exceeds a threshold limit below that of the error correction limit. The data error corrector can include a means for selecting the data output as the first decoded data segment when the quantity of error corrections made to produce the first decoded data segment falls below the threshold limit. The data error corrector can include a means for building a reconstructed encoded data segment from redundancy data, a means for determining one or more portions of the encoded data segment having reliability above a reliability threshold, and a means for establishing the redundant version of the encoded data segment as a combination of the one or more portions of the encoded data segment with one or more portions of the reconstructed encoded data segment.

The means for processing an encoded data segment into a first decoded data segment using at least an error correction scheme having an error correction limit, and means for processing a redundant version of the encoded data segment into a second decoded segment using at the least the error correction scheme can comprise any of can comprise any of intermediate storage 150, storage media 151, control system 160, media interface circuit 161, error correction circuit 162, link 170, storage controller 310, control circuitry 312, memory interface 313, storage media subsystem 320, storage array 330, and links 315 and 341. The means for selecting a data output as the second decoded data segment when a quantity of error corrections made to produce the first decoded data segment exceeds a threshold limit below that of the error correction limit, and means for selecting the data output as the first decoded data segment when the quantity of error corrections made to produce the first decoded data segment falls below the threshold limit can comprise any of intermediate storage 150, control system 160, error correction circuit 162, detection circuit 163, output circuit 164, error threshold 164, link 170, storage controller 310, host interface 311, control circuitry 312, and links 314-315. The means for building a reconstructed encoded data segment from redundancy data, determining one or more portions of the encoded data segment having reliability above a reliability threshold, and means for establishing the redundant version of the encoded data segment as a combination of the one or more portions of the encoded data segment with one or more portions of the reconstructed encoded data segment can comprise any of intermediate storage 150, storage media 151, control system 160, media interface circuit 161, error correction circuit 162, detection circuit 163, output circuit 164, link 170, storage controller 310, control circuitry 312, memory interface 313, storage media subsystem 320, storage array 330, and links 315 and 341.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above can be combined in various ways to form multiple embodiments. As a result, the invention is not limited to the specific embodiments described above, but only by the claims and their equivalents.

What is claimed is:

1. An apparatus, comprising:
    an error correction circuit configured to decode an encoded data segment using a selected error correction scheme having an error correction limit, and to determine a number of bit corrections made to the encoded data segment;
    a detection circuit configured to send a redundant version of the encoded data segment to the error correction circuit in response to the number of bit corrections satisfying a threshold limit set below the error correction limit to mitigate undetected errors in decoding the encoded data segment; and
    an output circuit configured to transfer resultant data decoded by the error correction circuit,
    wherein the error correction circuit employs a secondary error correction process on at least the redundant version of the encoded data segment, and
    wherein the secondary error correction process comprises:
        forming a reconstructed version of the encoded data segment using redundancy data;
        determining one or more portions of the encoded data segment exceeding a reliability threshold; and
        establishing the redundant version of the encoded data segment as a combination of the one or more portions of the encoded data segments with one or more portions of the reconstructed version of the encoded data segment.

2. The apparatus of claim 1, wherein the redundant version of the encoded data segment is constructed from at least the encoded data segment and redundancy data stored separately from the encoded data segment.

3. The apparatus of claim 1, wherein the encoded data segment is encoded using an error correcting code capable of correcting an amount of bit errors in the encoded data segment up to the error correction limit, and wherein the threshold limit is set at least one bit error below the amount of bit errors.

4. The apparatus of claim 1, wherein the threshold limit is selected based on a desired frame-miss error correction rate (FMCR) and/or an allowed frequency of using the redundant version of the encoded data.

5. An apparatus, comprising:
    a memory interface;
    a host interface; and
    a decoder configured to decode encoded data segments received over the memory interface to determine output data segments for transfer over the host interface;
    wherein the decoder produces first resultant data segments using a primary error correction process on the encoded data segments, and presents the first resultant data segments as the output data segments responsive to a secondary error correction process not being employed;
    wherein the decoder produces the output data segments using the secondary error correction process on redundant versions of the encoded data segments responsive to error corrections made on the encoded data segments with the primary error correction process exceeding a threshold quantity set below an error correction limit of the primary error correction process; and
    wherein the threshold quantity is selected based on a target frame-miss error correction rate (FMCR) and/or an allowed frequency of using the redundant versions of the encoded data segments.

6. The apparatus of claim 5, wherein the decoder retrieves redundancy data to construct the redundant versions of the encoded data segments when the secondary error correction process is employed, and wherein the secondary error correction process comprises at least one of a Redundant Array of Independent Dies (RAID) scheme and an exclusive-OR (XOR) scheme to construct the redundant versions of the encoded data segments.

7. The apparatus of claim 5, wherein the encoded data segments are encoded using a Bose-Chaudhuri-Hocquenghem (BCH) error correcting code that can correct a quantity of errors in the encoded data segment up to the error correction limit, and wherein the threshold quantity comprises a quantity of error corrections at least one bit error less than the error correction limit.

8. The apparatus of claim 5, wherein the decoder employs data reliability information in the secondary error correction process responsive to the primary error correction process indicating a successful convergence and the error corrections made on the encoded data segments exceed the threshold quantity.

9. The apparatus of claim 5, wherein the secondary error correction process comprises:
forming reconstructed versions of the encoded data segments using redundancy data retrieved over the memory interface;
determining portions of the encoded data segments exceeding a reliability threshold;
establishing the redundant versions of the encoded data segments as combinations of the portions of the encoded data segments with portions of the reconstructed versions of the encoded data segments; and
performing the primary error correction process on the redundant versions of the encoded data segments.

10. The apparatus of claim 9, wherein the redundancy data is obtained over the memory interface from at least one different physical memory die than of the encoded data segments.

11. The apparatus of claim 5, wherein the threshold quantity is selected based on a target difference between a frame-miss error correction rate (FMCR) and a frame error rate (FER) of the primary error correction process.

12. A method, comprising:
receiving an encoded data segment;
processing the encoded data segment into a primary decoded data segment using at least an error correction scheme having an error correction limit;
forming a reconstructed version of the encoded data segment using redundancy data,
determining one or more portions of the encoded data segment exceeding a reliability threshold; and
establishing a redundant version of the encoded data segment as a combination of the one or more portions of the encoded data segments with one or more portions of the reconstructed version of the encoded data segment;
based at least on a quantity of error corrections made on the primary decoded data segment using the error correction scheme exceeding a threshold quantity below that of the error correction limit, processing the redundant version of the encoded data segment into a secondary decoded data segment, and transferring the secondary decoded data segment as output data; and
based at least on the quantity of error corrections made on the primary decoded data using the error correction scheme not exceeding the threshold quantity, transferring the primary decoded data segment as the output data.

13. The method of claim 12, wherein the redundant version of the encoded data segment is constructed from at least the encoded data segment and redundancy data stored separately from the encoded data segment.

14. The method of claim 12, wherein the encoded data segment is encoded using an error correcting code capable of correcting an amount of bit errors in the encoded data segment up to the error correction limit, and wherein the threshold quantity is at least one bit error below the error correction limit.

15. The method of claim 12, wherein the threshold quantity is selected based on a desired difference between a frame-miss error correction rate (FMCR) and a frame error rate (FER) of the error correction scheme.

16. A computing system, comprising:
a processor; and
a cache device holding data cached for a storage device and comprising an error detection and correction (EDC) element configured to:
process requested portions of the data cached in an encoded state to produce resultant data based at least on a first error correcting code;
determine a quantity of detected errors found in the requested portions of the data when producing the resultant data;
based at least on the quantity of detected errors based on the first error correcting code falling below a threshold level, present the resultant data to the processor; and
based at least on the quantity of detected errors based on the first error correcting code exceeding the threshold level, identify redundant versions of the requested portions of the data, at least one of the redundant versions being corrected employing the first error correcting code, produce alternate secondary resultant data based at least on a second error correcting code on the at least one redundant versions, and present the alternate secondary resultant data to the processor.

17. The computing system of claim 16, wherein the first error correcting code can correct an amount of bit errors in the data cached in the encoded state up to an error correction capability, and wherein the threshold level is at least one bit error below the amount of bit errors.

18. The computing system of claim 16, wherein the alternate secondary resultant data supersedes the resultant data and corrects for one or more undetected errors in the resultant data.

19. The computing system of claim 16, wherein the threshold level is selected based on a desired difference between a frame-miss error correction rate (FMCR) and a frame error rate (FER) of the EDC element for the data.

20. The computing system of claim 16, wherein the data cached for the storage device comprises at least one logical-to-physical address table of the storage device that relates logical storage addresses employed by the processor to physical storage addresses employed by the storage device.

21. The computing system of claim 16, wherein to identify the redundant versions of the requested portions of the data, the EDC element is configured to:
form reconstructed versions of the requested portions of the data using redundancy data;
determine one or more sub-portions of the requested portions of the data exceeding a reliability threshold; and
establish the redundant versions of the requested portions of the data as combinations of the one or more sub-portions of the requested portions of the data with one or more portions of the reconstructed versions.

22. A data error corrector, comprising:
means for processing an encoded data segment into a first decoded data segment using at least an error correction scheme having an error correction limit;
means for building a reconstructed encoded data segment from redundancy data;
means for determining one or more portions of the encoded data segment having reliability above a reliability threshold; and
means for establishing a redundant version of the encoded data segment as a combination of the one or more portions of the encoded data segment with one or more portions of the reconstructed encoded data segment;
means for processing the redundant version of the encoded data segment into a second decoded data segment using at least the error correction scheme;

means for selecting a data output as the second decoded data segment when a quantity of error corrections made to produce the first decoded data segment exceeds a threshold limit below that of the error correction limit; and means for selecting the data output as the first decoded data segment when the quantity of error corrections made to produce the first decoded data segment falls below the threshold limit.

\* \* \* \* \*